United States Patent [19]
Biggs et al.

[11] Patent Number: 5,869,139
[45] Date of Patent: Feb. 9, 1999

[54] APPARATUS AND METHOD FOR PLATING PIN GRID ARRAY PACKAGING MODULES

[75] Inventors: Glen N. Biggs; John Di Santis, both of Wappingers Falls; Paul F. Findeis, Glenham; Karen P. McLaughlin, Poughkeepsie; Phillip W. Palmatier; Victor M. Vitek, both of Hopewell Junction, all of N.Y.

[73] Assignee: International Business Machines Corporation, Armonk, N.Y.

[21] Appl. No.: 808,925

[22] Filed: Feb. 28, 1997

[51] Int. Cl.$^6$ .................. B05D 5/00; B05C 3/00; C25D 17/08
[52] U.S. Cl. ............. 427/282; 427/304; 427/305; 427/430.1; 427/443.2; 118/406; 118/428; 118/503; 118/505; 118/50; 204/224 R; 204/297 M; 205/122; 205/125; 205/136
[58] Field of Search ................. 427/304, 305, 427/282, 443.2, 430.1; 118/406, 428, 503, 505, 50; 204/297 M, 224 R; 205/122, 125, 136

[56] References Cited

U.S. PATENT DOCUMENTS

| | | | |
|---|---|---|---|
| 5,223,110 | 6/1993 | Nolan et al. | 204/224 R |
| 5,228,966 | 7/1993 | Murata | 204/224 R |
| 5,342,495 | 8/1994 | Tung | 204/297 M |
| 5,405,518 | 4/1995 | Hsieh et al. | 204/297 R |
| 5,516,416 | 5/1996 | Canaperi et al. | 205/78 |
| 5,522,975 | 6/1996 | Andricacos et al. | 204/297 R |

OTHER PUBLICATIONS

Frankel, H et al.; IBM Technical Disclosure Bulletin; Plating Mask Fixture; vol. 11, No. 5; Oct. 1968, p. 464.

*Primary Examiner*—Janyce Bell
*Attorney, Agent, or Firm*—Whitham, Curtis & Whitham

[57] ABSTRACT

An apparatus and a method for its use for plating pin grid array packaging modules, with a fixture capable of simultaneously holding a plurality of said pin grid array modules such that three-dimensional bottom surface metallurgy (BSM) is sealingly protected during plating of top surface metallurgy (TSM).

8 Claims, 2 Drawing Sheets

APPARATUS AND METHOD FOR PLATING PIN GRID ARRAY PACKAGING MODULES

BACKGROUND OF THE INVENTION

1. Field of the Invention

The present invention generally relates to an apparatus and a method for plating pin grid array (PGA) packaging modules and, more particularly, relates to an apparatus and method for plating a plurality of pin grid array packaging modules at the same time using a fixture that protects and seals the pinned surfaces of the packaging modules during a plating operation.

2. Description of the Related Art

Pin grid array (PGA) packaging modules, such as those described in U.S. Pat. No. 5,516,416, are commonly used as integrated circuit chip carriers. These PGA packaging modules generally are ceramic packaging modules with cavity die attach and gold wire bonding with PGA contacts. However, another type of ceramic PGA package is a C4 (flipchip) package in which the chip is solder joined directly to the C4 pads (microsockets) on the top surface metallurgy (TSM). Alumina is frequently the ceramic material chosen while molybdenum or tungsten is commonly used in an alumina ceramic substrate as metallic conductors. These PGA packaging modules can include solderable or pluggable type packages. In the manufacturing of PGA packaging modules, after a conventional nickel plating of Mo or W surface features is first performed, pins are brazed onto the I/O pads with Cu-Ag or Ag as the typical brazing material.

In the context of such C4 (flipchip) packages, a need arises for selective plating of the TSM as the C4 pads only require a thin layer of gold, e.g., approximately 300 Å, while the pins require about 1 $\mu$m of gold. While Au-Sn type pins are known which would eliminate the need for such selective plating, KOVAR type pins that are electrolytically plated with nickel and gold layers are currently favored as they are considerably less expensive pin constructions.

As a consequence, selective plating has become necessary in which the top surface metallurgy (TSM) is immersion gold (Au) plated in one operation, while bottom surface metallurgy (BSM) of the PGA package module is electrolytically plated with nickel and gold layers in separate steps. The TSM is immersion gold plated in the C4 (flipchip) packages because C4 pads are not always connected to the pins where electrical contact is made during electrolytic plating. However, since electrolytic nickel and gold adheres poorly to diffused immersion gold, the industry has tried to eliminate the electroless immersion gold plating film from the pins. As one approach, packaging companies have immersion gold plated both the TSM and the BSM without attempting to protect the BSM during the immersion gold plating process. Thereafter, the TSM is protected while the immersion gold is etched off the pins. The drawback with this approach is that the need for stripping off the gold from the pins in this manner before the nickel and gold electroplating of the pins increases the fabrication cycle time and costs.

Nonetheless, the resort to such stripping of the electroless immersion gold off the pins is not surprising because of several difficulties in masking off BSM during immersion gold plating of TSM. First, because immersion gold plating of the TSM must be performed post braze, the BSM is already a three-dimensional structure at this stage of the process, and it is not a simple task by any means to mask off the three-dimensional array of pins. That is, the backside sealing of PGA packaging modules is complicated due to the sealing area available on the backside of the PGA substrate being limited to a very small area at the peripheral edge while protection must be ensured for the three-dimensional features of the pins themselves. Secondly, the electroless immersion gold bath process is generally performed in an immersion bath of potassium gold cyanide solution at approximately 80° C., and these bath conditions will preclude use of many common masking materials and plating tapes used in the semiconductor industry. Thirdly, the limited space available between the I/O pad center and the substrate edge in many current PGA package modules makes it challenging to provide a fixture which can hold the package in a way that ensures BSM sealing/protection without interfering with TSM gold plating operation. For example, 50 mm×50 mm PGA package modules may have an edge of substrate to center of I/O pad spacing of 1.907 mm while 44 mm×44 mm PGA package modules may have a substrate edge-to-pad center spacing of only 1.365 mm.

U.S. Pat. No. 5,522,975 (Andricacos et al.) teaches an electroplating workpiece fixture used for electroplating a workpiece having a flat bottom side. Due to the large surface area available on the flat backside of the workpiece, an o-ring is disposed in a complementary groove formed in a holder plateau to seal the flat backside while a vacuum is drawn at a vacuum port located in the holder plateau within the perimeter of the o-ring for drawing the backside of the workpiece against the seal while the opposite front surface of the workpiece is electroplated. While the workpiece is said to take any conventional form requiring uniform plating thickness thereon such as recording heads, packaging modules, or integrated circuits typically used in electronic devices or computers, the flat holder plateau and o-ring seal arrangement would only be structurally compatible with substrates having relatively flat backsides, not three-dimensional backsides such as those encountered in PGA packaging modules. In a somewhat similar vein, U.S. Pat. No. 5,228,966 (Murata) teaches a gilding apparatus including a vacuum chuck used for holding a flat surface of a semiconductor substrate and electrolytically plating the opposite face of the single workpiece.

SUMMARY OF THE INVENTION

It is an object of the present invention to provide an apparatus for plating a plurality of pin grid array (PGA) packaging modules simultaneously using a fixture that protects and seals the pinned surfaces of the packaging modules during a plating operation.

It is another object of the present invention to provide an method for plating a plurality of pin grid array (PGA) packaging modules simultaneously using a fixture that protects and seals the pinned surfaces of the packaging modules during a plating operation.

The foregoing and other objects of the invention are achieved by an apparatus and a method of its use for plating pin grid array modules, with a fixture capable of simultaneously holding a plurality of the pin grid modules during a plating operation. The fixture of this invention includes a base plate having an upper portion including a planar top surface bounding a plurality of receptacles which open to the planar top surface, wherein each receptacle has sidewalls and a receptacle bottom defining an internal space capable of accommodating a pinned surface of a pin grid module. A gasket means sits between the base plate and the bottom surface of the pin grid module when vacuum is pulled. Each of these receptacles thus includes a vacuum port through which a vacuum can be drawn and maintained between a bottom surface of a pin grid module and the base plate for releasably holding a pin grid module. The gasket means is supported by the planar top surface of the base plate, wherein the gasket means has a plurality of spaced openings that are centered and aligned with the base plate receptacles. A cover frame is used to mechanically clamp the gasket means to the base plate, wherein the cover frame has a plurality of spaced openings that are centered and aligned with gasket openings and the receptacles in the upper portion of the base plate.

The fixture can establish a vacuum sealing area on the three-dimensional, pinned backside of a PGA packaging module even though the flat area available on the backside of each PGA substrate for creating the seal is severely limited.

Because the fixture can hold and protect the pinned backside surfaces of a plurality of pin grid packaging modules simultaneously while an immersion plating operation is being performed on the opposite top surface metallurgy (TSM) of the module, the inventive apparatus enables high volume production at reduced manpower requirements and lower production costs.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1A:
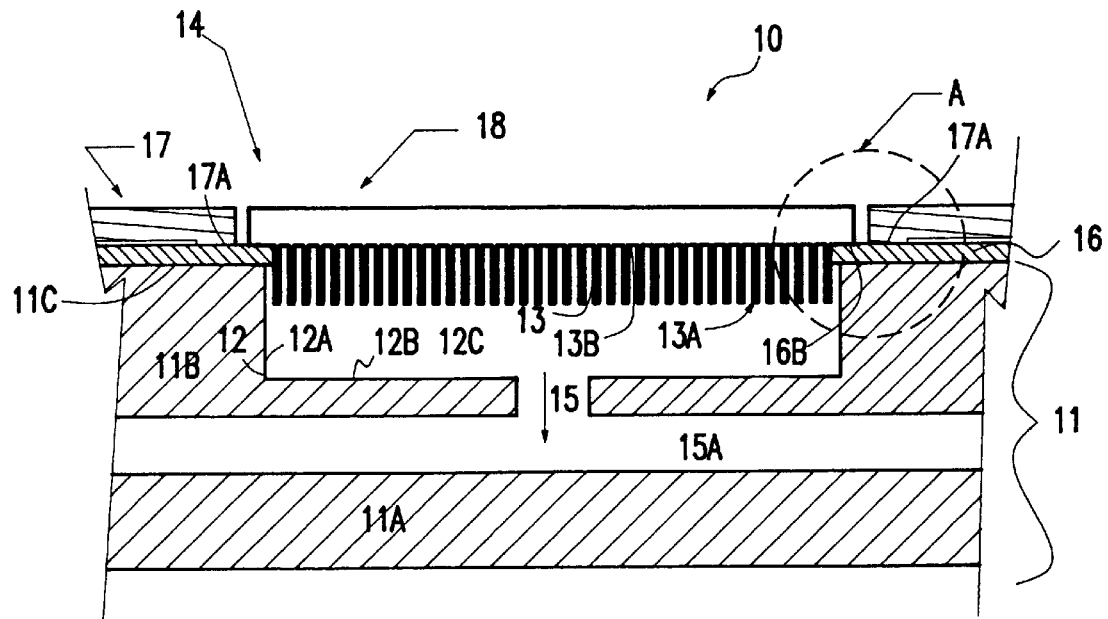
FIG. 1A illustrates in cross-sectional view of one of the plurality of PGA packaging module holders in the inventive fixture shown in FIG. 2A.
Figure 1B:
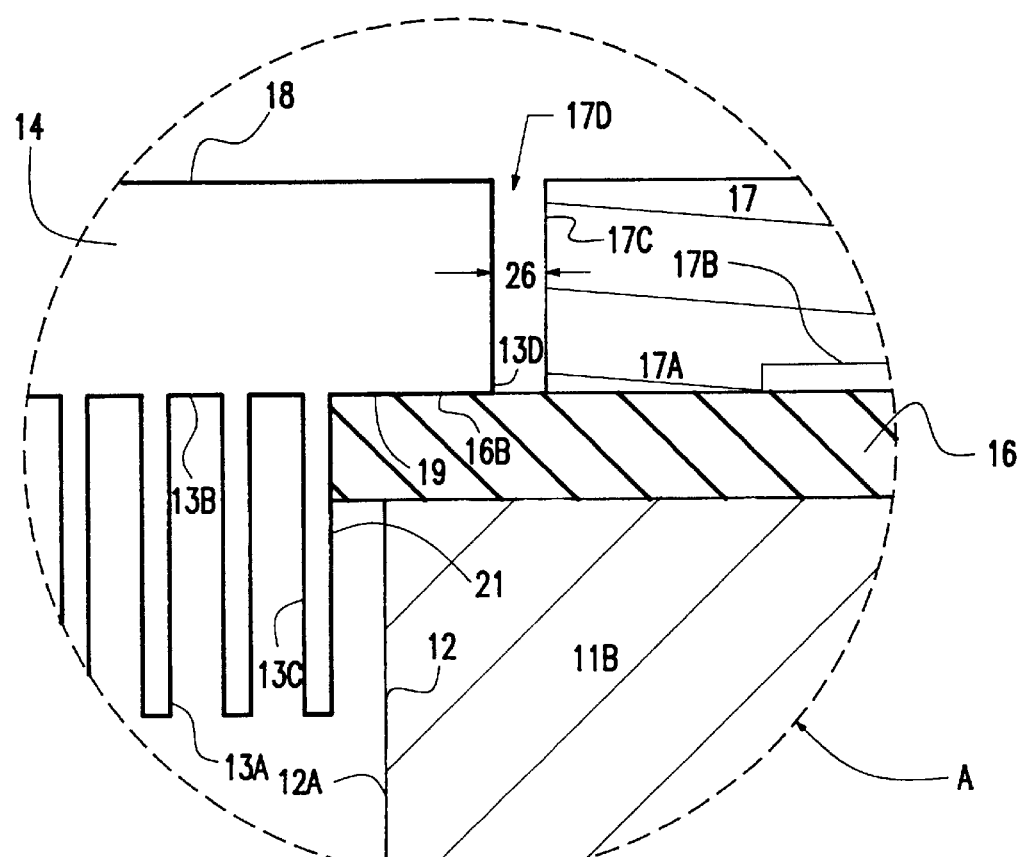
FIG. 1B illustrates in cross-sectional view is an enlarged view of area "A" indicated in FIG. 1A.
Figure 2A:
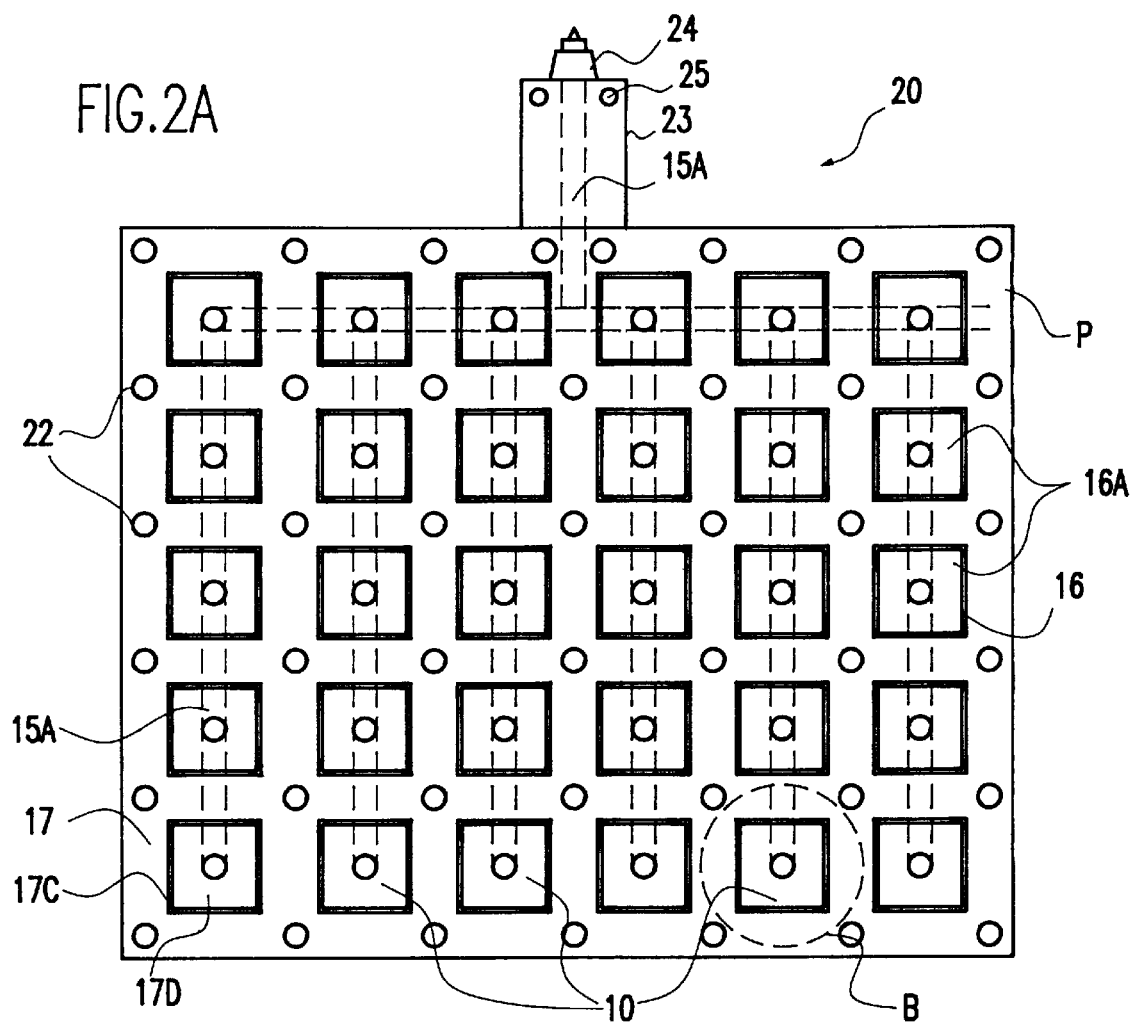
FIG. 2A illustrates a top view of a vacuum fixture of the invention showing an array of PGA packaging module holders.

Referring now to the Figures, a partial cross-sectional representative view is illustrated in FIG. 1A of a holder 10 provided in a fixture 20, such as shown in FIG. 2A, used in an embodiment of this invention for plating PGA packaging modules 14. The PGA packaging modules 14 each has a top surface metallurgy (TSM) 18, and an opposite bottom surface metallurgy (BSM) comprising a pinned surface 13 comprising a multiplicity of pins 13a brazed onto the backside 13b of the PGA module 14, where the backside 13b has limited flat surface area 13c remaining available for creating a vacuum seal around the perimeter of the backside 13b (see FIG. 1B). One important purpose and function of the inventive fixture is to protect the BSM pinned surface 13 from unwanted metal plating during immersion plating of the TSM 18.

The fixture 20 is especially useful in immersion gold plating of the TSM that arises in C4 (flipchip) packages because C4 pads are not always connected to the pins where electrical contact is made during electrolytic plating. Therefore, the plating equipment of this invention can be used to advantage in electroless gold plating of TSM of C4 (flipchip) packages. An immersion gold bath of potassium gold cyanide solution at approximately 80° C. can be used as the plating solution for the TSM.

As to the fixture 20 of this invention used to handle the package during the immersion plating operation for the TSM, a plurality of holders 10 will be spaced across the surface of the fixture 20 in an array, as shown in FIG. 2A. It will be understood that the edge profile or shape "P" of the fixture 20 is not particularly limited and is largely dependent on the plating tank design. Since the plurality of holders 10 shown in FIG. 2A will have the same dimensions for mass production of PGA modules of the same construction, the construction and manner of function of a single holder 10 as described in detail herein will similarly apply to all other holders provided in the common fixture.

In FIG. 1A, the isolated holder 10 in the fixture has a base plate 11. The base plate 11 is an integral rack-like structure having a solid bottom portion 11a and a solid upper portion 11b including a planar top surface 11c bounding a plurality of receptacles 12 which open to said planar top surface 11c, and vacuum channels 15a are provided within the base plate 11 which can fluidly communicate with the receptacles 12 via ports 15. Each receptacle 12 has sidewalls 12a and a receptacle bottom 12b defining an internal space 12c capable of accommodating the pinned surface 13 of a pin grid array module 14.

Each of the receptacles 12 includes a vacuum port 15 shown in FIG. 1A through which a vacuum can be drawn. The vacuum created can be maintained between the bottom surface 13b of the pin grid module 14 and the top surface 16b of a gasket means 16 for releasably holding the pin grid array module 14 (e.g., see FIG. 1B).

The gasket means 16 is supported by the planar top surface 11c of the upper portion 11b of base plate 11, as seen in FIG. 1A. The gasket means 16 has a plurality of spaced openings 16a (see FIG. 2A) defined therein that are centered and aligned respectively with the base plate receptacles 12.

As a practical matter, the gasket opening 16a must be sized smaller than the corresponding lateral dimensions of the bottom (pinned) side 13 of the PGA module 14 so that a vacuum seal can be created between the top side 16b of the gasket 16 where it overlaps and confronts the bottom flat 13b of the PGA module 14 when a vacuum is created in the receptacle 12. That is, each side edge 13d of the pinned surface 13 of the PGA module 14 must overhang and rest upon (i.e., "overlap") underlying top surface areas 16b of the gasket means that bound an opening 16a in the gasket 16. This overhang/overlap is indicated in FIG. 1B, and the amount of this overlap 19 preferably should be approximately 1 mm.

The gasket material 16 is a compressible, resilient material that can create a vacuum seal with the backside (pinned surface) of the PGA module. The gasket 16 is a single unitary element having a plurality of spaced apart openings 16a formed therein of the correct dimensional sizings and spacing from each other to permit a plurality of PGA packaging modules 14 to be simultaneously, hermetically gripped by vacuum at their pinned undersides 13. The array of openings 16a in the gasket 16 are interconnected by a continuous sheet of gasket material, which preferably is a flexible polymeric material. The gasket should have a uniform thickness. A plurality of openings is provided in the gasket 16, e.g. 2–60 openings, or even more if desired, space permitting, thereby providing higher production volumes as more than one PGA package module can be processed simultaneously on the fixture.

A preferred resinous polymeric elastomeric gasket material is neoprene (i.e., poly(2-chloro-1,3-butadiene)). Neoprene is an oil-resistant synthetic rubber having a molecular weight in the range of 100,000 to 300,000, with a predominantly trans configuration, and it can be made by a conventional process involving polymerization of chloroprene. The Shore A value range for the gasket material is generally in the range of 30 to 70, preferably about 40 to about 50. The Shore hardness test (ASTM D2240) is made with a Durometer instrument using a Shore A indentor.

A cover frame or template 17 is used to mechanically clamp the gasket means 16 to the upper base plate portion 11b. The cover frame 17 can be secured to the upper base plate portion 11b in any convenient manner, such as by bolting the frame (and gasket means 16) to the upper base plate portion 11b, such as through threaded holes 22 provided at peripheral areas of the fixture 20 (see FIG. 2A). The cover frame 17 has a plurality of spaced apart openings 17d. Each opening 17d is bounded by edgewalls 17c and it is centered and aligned with a gasket opening 16a (see FIG. 2A), as well as with a receptacle 12 in the upper portion 11b of the base plate 11.

The underside 17b of the cover frame 17 also has a slight protuberance or ridge 17a distending downward toward the gasket 16, as can be seen in FIG. 1A. The ridge 17a mechanically clamps the gasket 16 down and keeps the gasket 16 from slipping out of place during loading and processing (viz., immersion gold plating of the TSM).

Generally the receptacles 12, gasket openings 16a, and frame openings 17d, will be square-shaped to accommodate most PGA packaging modules; although the perimeter shape of these openings, from a practical standpoint, could be shaped to accommodate virtually any packaging module profile (from a plan view perspective).

In the exemplified embodiment, the base plate 11 and cover frame 17 preferably are formed of a suitable dielectric or electrical insulator as well as being resistant to corrosion from the plating solution. For example, the cover frame 17 and base plate 11 can be constructed of polyvinylidene fluoride (PVDF).

Figure 2B:
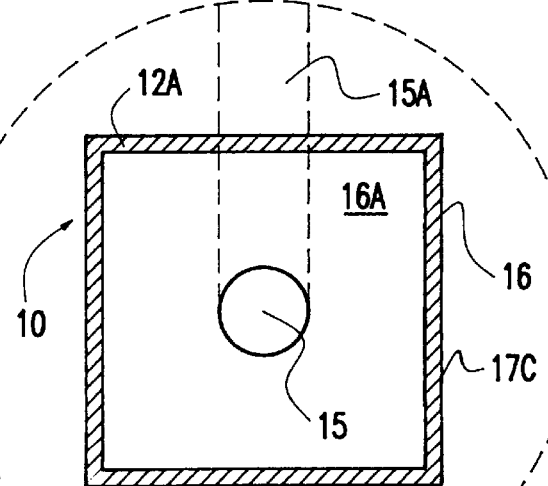
FIG. 2B illustrates in cross-sectional view is an enlarged view of area "B" indicated in FIG. 2A.

As shown in FIG. 1B, the gap 26 between an edgewall 17c of an opening 17d in the cover frame 17 and the opposing surface 13d of PGA packaging module 14 must be large enough to permit access to and handling of the module 14 in and out of the receptacle 12, but, on the other hand, must be close enough to allow the ridge 17a to maintain a sufficient grip on the gasket 16 to keep it from slipping. As a result, and as best seen FIG. 2B, a portion of the gasket 26 is visible in each holder 10. The ridge 17a preferably is continuous and completely encircles the receptacle 12, although an intermittent ridge may suffice if the protuberances are sufficient in number and proximity to each other. The sidewalls 12a of receptacle 12 are indicated by hatched lines in FIG. 2B. Also, the amount of overhang 21 of the gasket 16 from the upper portion 11b of the base plate 11, as best seen in FIG. 1B, preferably is about 0.15 mm.

In using the apparatus of this invention to plate a PGA packaging module, the following basic protocol can be practiced. A plurality of PGA packaging modules 14 are individually placed in separate receptacles 12 of the fixture 20 with the pinned surface (BSM) 13 facing the base plate 11 of the fixture with the flat perimeter edges 13c of the backside of the module 14 resting on the top side 16b of gasket 16.

The vacuum port 15 fluidly connects the receptacle space 12c with a vacuum channel 15a extending through the base plate 11. The vacuum channel 15a is in fluid communication with a vacuum valve fitting 24 (FIG. 2A) attached to the stem 23 of the fixture 20, such as a quick-connect, self closing plug valve, as described in U.S. Pat. No. 5,522,975 which description is incorporated herein by reference. A vacuum pump (not shown) is operatively connectable to the vacuum valve for creating a vacuum between the PGA module backside flat 13c resting on the top side 16b of gasket 16. In operation, the vacuum pump is temporarily connected to the vacuum valve and a vacuum is drawn for sucking the backside 13 of the PGA module 14 against the gasket means 16 which slightly compresses the gasket means 16. The vacuum pump is disconnected from the vacuum valve which automatically closes and thereby maintains a vacuum under the PGA module 14 for holding it to the gasket means 16.

The fixture is then loaded into a plating cell (not shown) by any convenient technique, such as by manually or robotically suspending the assembled fixture on a flybar and carrying the flybar with the suspended fixture therefrom using a lifting hook or other suitable carrier means mounted in carrier holes 25 provided in the fixture stem 23 (FIG. 2A), which may also be manually or robotically controlled. The plating process may then be completed for depositing the desired metal film, e.g., gold, on the TSM 18 of the modules 14. The gasket means 16 maintains the vacuum holding force as well as prevents any undesirable entry of the plating solution behind the PGA module at the pinned surface 13 of the module 14 during immersion plating of the TSM 18. The plated modules 14 may then be readily removed by reversing the fixture assembly process.

The improvements in loading procedures achieved by the present invention have been demonstrated to reduce yield loss from inadvertent plating of BSM due to rack failure to almost zero in 44 mm×44 mm PGA packaging modules. This is remarkable because the holders 10 in the fixture are being required to establish a vacuum sealing area on the three-dimensional, pinned backside of a PGA packaging module even though the flat area available on the backside of each PGA substrate for creating such a seal is severely limited.

Other holder configurations not described in detail herein are also within the scope of the invention. For instance, it is also possible to provide only a single holder in the fixture for batch style operation where mass production is not needed, or a plurality holders having different sizing dimensions can be provided in a common fixture, as long as the holders have the basic construction and manner of operation described herein.

While the invention has been described in terms of its preferred embodiments, those skilled in the art will recognize that the invention can be practiced with modification within the spirit and scope of the appended claims.

What is claimed is:

1. An apparatus for plating pin grid array modules equipped with a pinned surface, comprising:
   a fixture for holding a plurality of said pin grid modules at the same time, comprising:
   a base plate having an upper portion including a planar top surface bounding a plurality of receptacles in said upper portion which open to said planar top surface, wherein each receptacle has sidewalls and a receptacle bottom defining an internal space capable of accommodating a pinned surface of a pin grid module, and each said receptacle includes a vacuum port through which a vacuum can be drawn and maintained between a bottom surface of a pin grid module and said base plate for releasably holding a pin grid module;

a gasket means having a top side and a bottom side wherein said bottom side is supported by said planar top surface of said base plate, and wherein said gasket means has a plurality of spaced openings centered with said receptacles in said upper portion of said base plate; and a cover frame having a plurality of spaced openings centered with said gasket openings and said receptacles in said upper portion of said base plate, said cover frame having a cover frame bottom surface and top surface, wherein said cover frame bottom surface includes a protuberance capable of exerting clamping pressure on said top side of the gasket means.

2. The apparatus of claim 1, wherein said gasket means comprises a compressible elastomeric material.

3. The apparatus of claim 1, wherein said gasket means comprises neoprene.

4. The apparatus of claim 3, wherein said gasket means has a Durometer "A" hardness reading between about 30 to about 70.

5. The apparatus of claim 1, wherein said base plate comprises a dielectric material.

6. The apparatus of claim 1, wherein said cover frame comprises a dielectric material.

7. A method for simultaneously plating a plurality of pin grid array packaging modules equipped with a pinned surface, comprising the steps of:

(a) providing a fixture for holding a plurality of said pin grid modules at the same time, comprising:

a base plate having an upper portion including a planar top surface bounding a plurality of receptacles in said upper portion which open to said planar top surface, wherein each receptacle has sidewalls and a receptacle bottom defining an internal space capable of accommodating a pinned surface of a pin grid module, and each said receptacle includes a vacuum port through which a vacuum can be drawn and maintained between a bottom surface of a pin grid module and said base plate for releasably holding a pin grid module;

a gasket means having a top side and a bottom side wherein said bottom side is supported by said planar top surface of said base plate, and wherein said gasket means has a plurality of spaced openings centered with said receptacles in said upper portion of said base plate; and a cover frame having a plurality of spaced openings, said cover frame having a cover frame bottom surface and top surface, wherein said cover frame bottom surface includes a protuberance;

(b) inserting said PGA packaging modules into said receptacles such that portions of said backside of the pin grid modules rest flush upon said top surface of said gasket means;

(c) mounting said cover frame onto said gasket such that said cover frame openings are centered with said gasket openings;

(d) fastening said cover frame to said base plate such that said protuberance on said frame bottom surface exerts clamping pressure on said top side of the gasket means;

(e) creating a vacuum in said receptacles; and (f) immersing said fixture in a plating bath effective to metal plate a top surface metallurgy (TSM) of the PGA packaging modules while protecting said pinned surface from plating.

8. The method of claim 7, wherein said metal plating is gold.

* * * * *